United States Patent [19]

Doddrell et al.

[11] Patent Number: 4,945,308

[45] Date of Patent: Jul. 31, 1990

[54] VOLUME SELECTED NMR SPECTROSCOPY

[75] Inventors: David M. Doddrell, Westlake; William M. Brooks, Mount Gravatt, both of Australia

[73] Assignee: University of Queensland, Queensland, Australia

[21] Appl. No.: 283,482

[22] PCT Filed: Apr. 24, 1987

[86] PCT No.: PCT/AU87/00113

§ 371 Date: Oct. 28, 1988

§ 102(e) Date: Oct. 28, 1988

[87] PCT Pub. No.: WO87/06700

PCT Pub. Date: Nov. 5, 1987

[30] Foreign Application Priority Data

Apr. 24, 1986 [AU] Australia ............... PH5608

[51] Int. Cl.$^5$ .......................... G01R 33/20
[52] U.S. Cl. ..................... 324/309; 324/307
[58] Field of Search .............. 324/300, 307, 309; 128/653

[56] References Cited

U.S. PATENT DOCUMENTS

| 4,480,228 | 10/1984 | Bottomley | 324/309 |
| 4,486,709 | 12/1984 | Bendall | 324/309 |
| 4,698,592 | 10/1987 | Feinberg | 324/309 |
| 4,727,324 | 2/1988 | Bendall et al. | 324/309 |
| 4,733,185 | 3/1988 | Bottomley | 324/309 |
| 4,777,439 | 10/1988 | Granot | 324/309 |
| 4,816,764 | 3/1989 | Weber | 324/309 |

FOREIGN PATENT DOCUMENTS

| 59733/86 | 1/1987 | Australia . |
| 128424 | 12/1984 | European Pat. Off. . |
| 167127 | 1/1986 | European Pat. Off. . |
| 182481 | 5/1986 | European Pat. Off. . |
| WO85/00887 | 2/1985 | PCT Int'l Appl. . |

Primary Examiner—Michael J. Tokar
Attorney, Agent, or Firm—Foley & Lardner, Schwartz, Jeffery, Schwaab, Mack Blumenthal & Evans

[57] ABSTRACT

A method for volume-selected NMR spectroscopy where an rf pulse of selected bandwidth, in the presence of a field gradient superimposed upon an initial homogenous magnetic field, rotates a slice of magnetization into the transverse plane, and it then uses a high power refocussing pulse to refocus the phase roll that accompanies the rf pulse. After an appropriate time, the magnetization is pulsed back to the homogenous magnetic field axis and the gradient collapsed. A read pulse is used to tip the magnetization of interest into the transverse plane for acquisition in the absence of applied gradients.

7 Claims, 3 Drawing Sheets

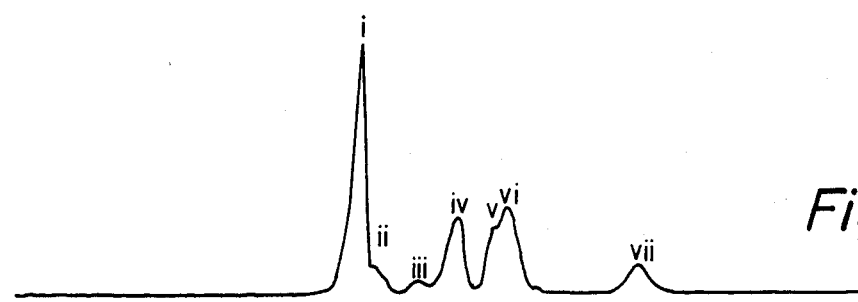
Fig.2A
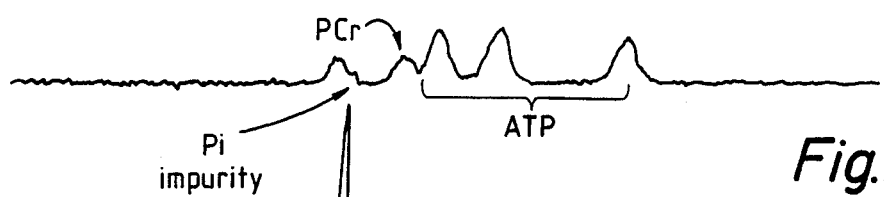
Fig.2B
Fig.2C
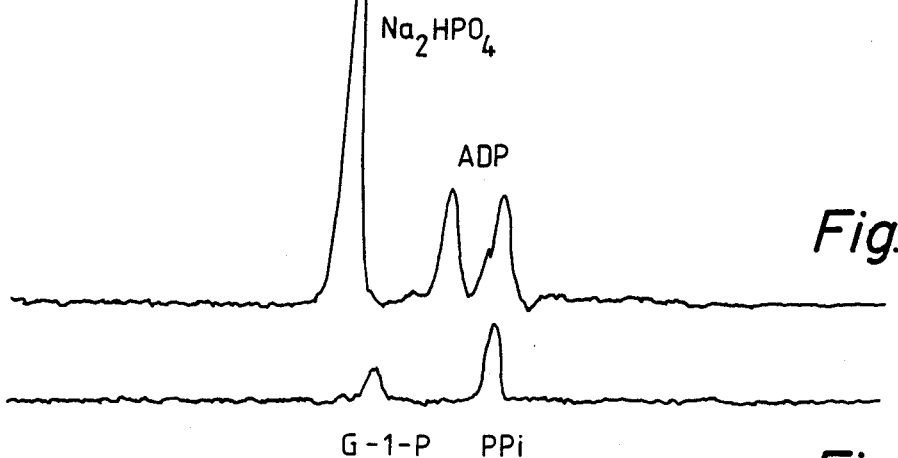
Fig.2D

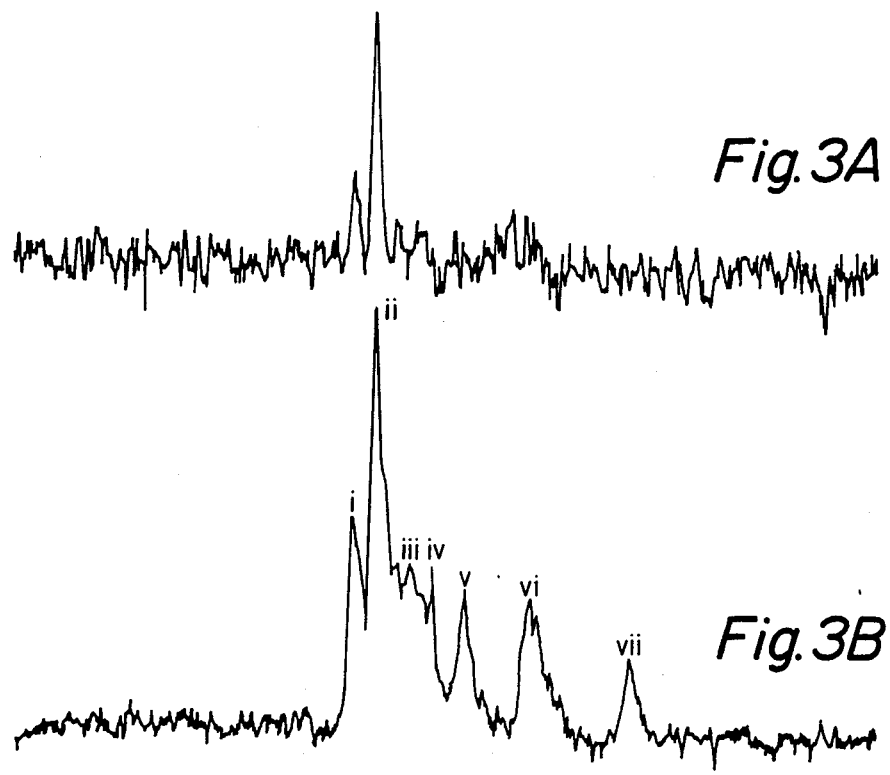

VOLUME SELECTED NMR SPECTROSCOPY

BACKGROUND OF THE INVENTION

(1) Field of the Invention

This invention relates to improvements in volume-selected NMR spectroscopy.

(2) Prior Art

With the recent development of wholebody NMR spectroscopy, there is a need to find a technique to obtain high quality spectra from a particular volume in space. In this way, biochemical data may be obtained from one organ, or preferably from selected regions within such an organ, in a non-invasive manner. There have been a number of methods proposed to do this and these fall into three broad groups. They are:

(1) The use of a pulse train which exploits the pulse inhomogeneity to select a volume within a sample by selecting only the region with a particular pulse angle;

(2) The use of some form of field profile technique to produce a region of high magnetic field homogeneity within a larger region where the field changes sharply with position. (The result is that high resolution spectra are obtained from the region of interest whilst signals arising from the inhomogeneous region are so broad that they may be eliminated from spectra.)

In principle, methods (1) and (2) generally rely upon physical movement of the sample within the system to obtain signals from various regions.

(3) The third method is to use a combination of frequency selective radio-frequency pulses in the presence of magnetic field gradients to effect volume selection. It appears that this third approach may well be the most useful as it combines the versatility of complete software control of gradients and selective excitation pulses to produce volume-selection in all three directions. As well, the technique may be image encoded, the consequence being that the position of the selected volume is accurately known.

For effective use in practice, strong signal-to-noise must be obtained from any particular technique. To do this, we must keep three objects in mind:

(1) Maximum signal should be excited within the confines of the slice of choice:

(2) Magnetization of interest should remain in the transverse plane for as little time as possible particularly while applied field gradients are present. The resultant loss of coherence leads to a reduction in signal strength: and (3) The spectra should be obtained after applied gradients have reached zero amplitude so that line widths are narrow and the chemical shifts displayed are those present independent of volume selection.

These last two points combined mean it is preferable to have the magnetization aligned with the field axis while gradients are being changed.

Some of the methods proposed previously for volume-selection include, DRESS, [*Depth-resolved surface-coil in spectroscopy (DRESS) in vivo* $^1H$, $^{31}P$, and $^{31}C$ NMR, P. A. Bottomley, T. H. Foster and R. D. Darrow, J. Magn. Reson. 59, 338, (1984)]; VSE (H. Post, D. Ratzel and P. Brunner, West German Patent No. 3209263-6, Mar. 13, 1982, and also *Volume-selected Excitation. A novel approach to topical NMR*. W. P. Aue, S. Miller, T. A. Cross and J. Seeliq. J. Magn. Reson. 56, 350 (1984)]: and ISIS, [*Image-selected in vivo Spectroscopy (ISIS). A new technique for spatially selective NMR Spectrosscopy*. R. J. Ordidge, A. Connelly and J. A. B. Lohman. J. Magn. Reson. 66, 283, (1986)]; These methods involve the application of narrow bandwidth radio-frequency excitation in the presence of a field gradient applied across the sample. The gradient is then switched off and the signal acquired. In principle, these methods can be extended to include slicing in all directions.

The known methods can be summarised as follows:

(1) DRESS uses a selective rf pulse in the presence of an applied field gradient to excite a slice of magnetization. Gradient reversal is then used to form a spin-echo which refocusses the off-resonance effects of the pulse. The major drawback of this method is that the magnetization of interest lies in the transverse plane during refocussing and so is $T_2$ contrasted. Furthermore the acquired signals are either gradient broadened or reduced in intensity or both because of the need to allow gradient fall to occur before switching the receiver on. Volume selection is only one dimensional and the finite dimensions of the receiver coil are used to limit the volume in the plane of the slice.

(2) ISIS is based on a phase inversion between signals in the slice of interest and those arising from outside. This is carried out by applying an inversion pulse tailored to the appropriate bandwidth in the presence of a gradient. The volume-selected spectrum is obtained by adding and subtracting appropriate combinations of phase inverted signals in the computer memory. The primary disadvantage of ISIS is that it relies on the ability of the computer to distinguish between the small signals within the volume of interest and the residual signal which will often be several orders of magnitude stronger. This, of course, is reliant upon the dynamic range of the computer memory as well as the spectrometer preamplifier and receiver systems.

(3) SPARS uses a refocussing pulse to form a spin-echo in the presence of an applied field gradient. A selective pulse of appropriate bandwidth is then applied to rotate the magnetization in the slice of interest back to the applied field direction following which the gradient is collapsed. This is carried out in all directions to yield the desired volume of interest which can then be read out with a single pulse. In this method the magnetization of interest suffers the effect of three gradient rises or falls while it is in the transverse plane for each direction of slicing which means any irrecoverable losses associated with gradient rises or falls are extreme. The time for refocussing is extended because gradient changes require finite time whereupon $T_2$ relaxation becomes important. The sensitivity of this technique is also dependent on efficient refocussing and on applying the selective pulse at precisely the correct moment. It appears that the phase evolution of the signal during this pulse also contributes to the weakening of signal strength.

(4) VSE uses a composite pulse cluster in the presence of a field gradient for slice selection. It is of the form $\pi/4(x)\pi/2[x]\pi/4(x)$ where, by convention, $\pi/4(x)$ signifies a 45° selective pulse of some sort applied along the x axis and $\pi/2[x]$ signifies a 90° pulse applied to all spins. Ideally the spins within the slice feel the sum of all pulses, i.e. a $\pi$ rotation while those outside feel only a 90° rotation and their transverse phase coherence is dephased by the slice gradient. However, off-resonance effects of the hard pulse mean that signals arising from outside of the slice are not eliminated in one pass through the pulse cluster. In fact even by using a phase cycle to implement an add/substract routine, there is a significant residual signal. The VSE technique is discussed in [*Discrete isolation from Gradient-Governed Elimination of Resonances. DIGGER, a new technique for in vivo volume-selected spectroscopy.* D. M. Doddrell, J. M. Bulsing, G. J. Galloway, W. M. Brooks, J. Field, M. G. Irving and H. Baddeley. J. Magn. Reson. 70, 319 (1986)], showing how this residual signal reduces the quality of the final spectrum.

SUMMARY OF THE PRESENT INVENTION

It is an object of the present invention to provide a method of volume-selected NMR spectroscopy which exhibits good volume-selection characteristics.

It is a preferred object of the present invention that it can obtain NMR spectra from a small well defined region of space, without the need to change or move either the apparatus used to carry out the technique or the sample body.

Other preferred objects of the present invention are to obtain this data with (1) high signal to noise, (2) little or no $T_2$ distortion, (3) low radiofrequency pulse power, (4) high spectral resolution, (5) complete volume selection within a single pass through the pulse sequence and, (6) the ability to locate the volume element of interest from information obtained from a NMR image.

Just as in previously known methods for volume-selection, the present invention uses the relation between nuclear magnetic Larmour frequency and magnetic field strength. By applying a suitable rf pulse to the sample body in the presence of a field gradient superimposed upon the initial homogeneous magnetic field, certain spins can be excited. If the frequency of this excitation pulse and the strength of the gradient are known, the position and size of this volume element can be accurately known.

In broad aspect, the present invention is directed to a method of volume-selected NMR spectroscopy where slice selection is facilitated by a pulse of selective band width applied in the presence of a field gradient. Before this gradient is switched off, a hard refocussing pulse and delay are used to refocus the signal phase roll which accompanies the soft pulse. This refocussed coherence is pulsed back to the z-axis before the gradient is collapsed.

While this effect is of little consequence in high power broad band excitation, it becomes of paramount importance as pulse lengths become extended and is a key requirement when selective pulses are employed. In many cases, the phase shift noted above is linearly dependent on resonance off-set within the band width of the pulse. Thus it can be shown both theoretically and in practice, that a constant refocussing time can be used to refocus coherence across the bandwidth of the pulse. This time is dependent on the duration of the pulse. Thus the initial slice selection pulse cluster is preferably of the form $$G_{sl} \diagup \qquad \diagdown$$
$$rf \quad \frac{\pi}{2}(x)\pi[\pm y, \pm x] - \tau -$$

where, by convention, $\pi/2(x)$ indicate some form of selective excitation which rotates magnetization through 90° (in this work this is preferably a sinc pulse), $\pi[\pm y, \pm y]$ implies a non-selective 180° pulse which follows an exorcycle during 4 cycles through the pulse sequence and $\tau$ is the appropriate refocussing time. In the presence of a suitable gradient, maximum coherent transverse signal will now be obtained from spins within the slice.

It now remains to record the signal in the absence of the gradient. To do this, the magnetization is preferably pulsed back to the z-axis so that the dephasing of transverse coherence which takes place in the presence of gradients has no effect on the excited slice. After a suitable time determined by the rate at which the gradients fall to zero, the magnetization of interest is again pulsed to the transverse plane and the signal may be acquired with the high resolution chemical shift information required for useful biochemical analysis.

The pulse sequence then becomes $$G_{sl} \diagup \qquad \qquad \diagdown$$
$$rf \quad \frac{\pi}{2}(x)\pi[\pm y, \pm x] - \tau - \frac{\pi}{2}[\pm x] - t_1 - \frac{\pi}{2}[\pm x] \text{ acquire}$$

BRIEF DESCRIPTION OF THE DRAWINGS

To enable the invention to be fully understood, a preferred embodiment will now show how this technique can be extended to slice in further dimensions, the preferred embodiment being described with reference to the accompanying drawings in which:

FIG. 2 shows the volume-selective spectra recorded from the three vials discussed in the text. FIG. 2(a) shows the spectrum arising from all three vials using 128 $\pi/2$ pulses. Spectral assignments are as follows:

Figure 1:
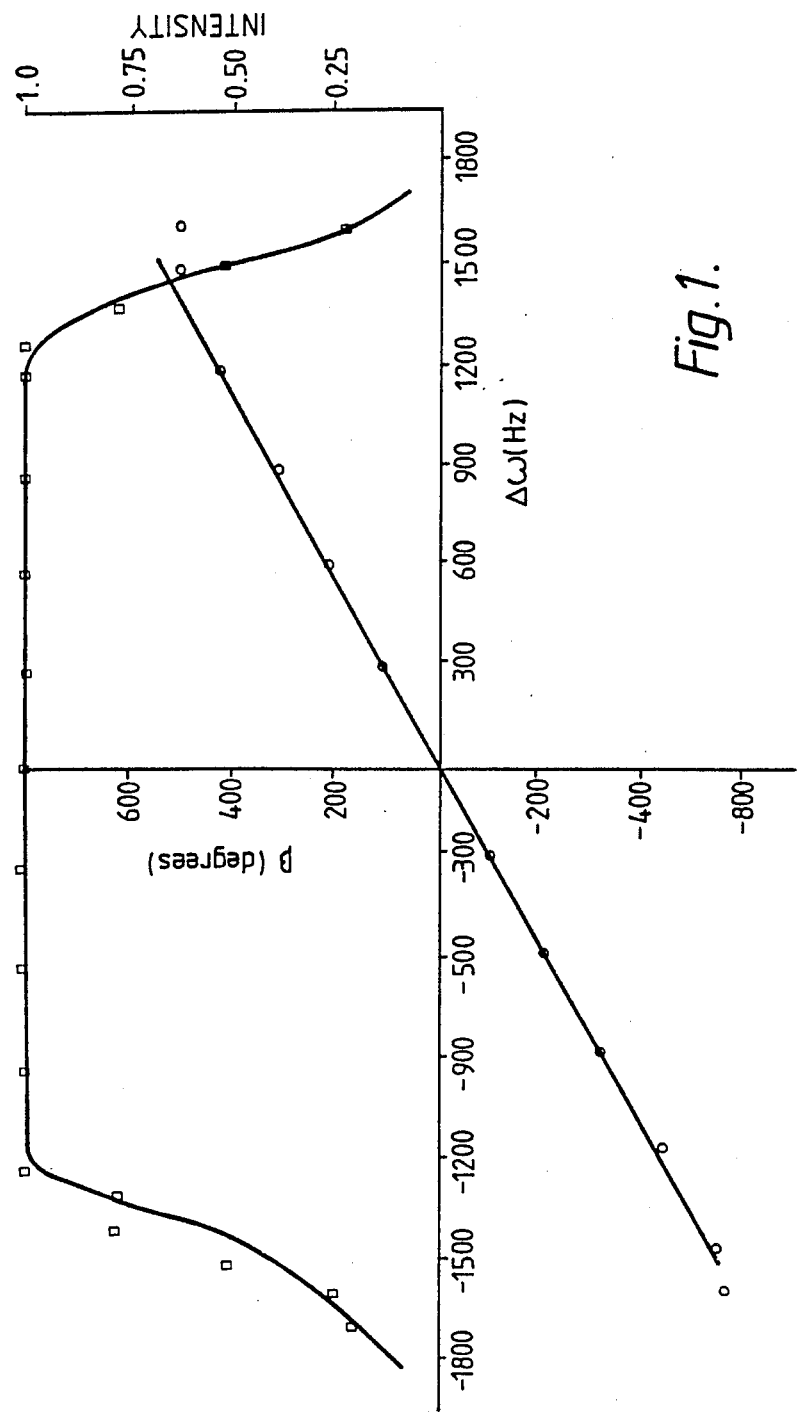
FIG. 1 shows the calculated variation in phase and intensity of the transverse magnetization generated following a 2.048ms sinc pulse as the amount off-resonance is varied. (The nutation angle on-resonance was $\pi/2$rad. The experimental points were determined using the $^{31}P$ resonance from a solution of $Na_2HPO_4$.)

(i) $Na_2HPO_4$;
(ii) G-1'1-P;
(iii) PCr;
(iv) $\alpha$-ATP and $\beta$-ATP;
(v) PPi;
(vi) $\alpha$-ATP and $\beta$-ADP;
(vii) $\beta$-ATP.

FIG. 2(b) shows excitation set to select vial (3). FIG. 2(c) shows excitation set to select vial (2). FIG. 2(d) shows excitation set to select vial (1). (Each volume-selected spectrum represents the average of 128 scans using a recycle time of 5s.); and FIG. 3 shows the in vivo $^{31}P$ spectrum determined from the leg of a Dark Agouti rat as per text. Spectrum (A) is the two-dimensional volume-selected spectrum following 1024 scans showing signals from the internal space of the tumour. Spectrum (B) is the normal spectrum from the whole leg following 128 scans using a $\pi/2$ pulse angle, recycle time 4s. Assignments are as follows:

(i) Sugar phosphate;
(ii) Pi;
(iii) Phosphodiesters;
(iv) PCr;
(v) $\alpha$-ATP;
(vi) $\alpha$-ATP and NAD; and
(vii) —ATP.

DETAILED DESCRIPTION OF THE PREFERRED EMBODIMENTS

All experiments were performed upon a Bruker MSL-100 spectroscopic system with a 2.35T 40cm bore magnet. A probe was built to accommodate small samples ($\simeq$40mm). It consisted of two coils both tuned to 40MHz. One coil, (diameter$\times$250mm) was built to accept high power (1.5kW) transmitted pulses. The second, a receiver coil, was constructed orthogonal to the original and had a smaller diameter (50mm) and so improved the filling factor for the smaller phantom and biological samples used in this work. Coupling between these coils was eliminated by careful positioning and so pulse power loss and signal reduction was minimized during pulse and receive experiments.

Samples used in these experiments were as follows:
(A) An aqueous sample of sodium phosphate (50mM);
(B) Three sample vials (5mls) containing:
  (1) sodium pyrophosphate ($Na_4P_2O_7$) (120mM) and glucose-1-phosphate (G-1-P);
  (2) sodium phosphate ($Na_2HPO_4$) 50 mM) and adenosine diphosphate (ADP) (160mM) (pH$\times$7.4); and
  (3) phosphocreatine (PCr) (180mM) and adenosine triphosphate (ATP) (200mM) (pH$\times$7.4).

These were arranged so that the bottles were placed at the apices of an equilateral triangle; the long axes of the vials parallel with the y-axis of the magnet. In vivo volume-selection was carried out on a Dark Agouti female rat (200mg) with a tumour (5g) growing on one hind leg. Anaesthesia was by Ketalar (30mg) and Diazepam (0.1 ml). The temperature within the probe head during experiments was 30° C.

In all experiments discussed here, selective excitation was by a (sin x)/x (SINC) shaped pulse of duration 2 ms. The pulse power for this pulse was set by observing the signal obtained from sample A after the pulse sequence $\theta(P,x)$ $\pi/2[P,x]$, acquire $^{31}P$ with the sample on resonance. When $\theta\times\mu/2$ a null signal was obtained. Hard pulse times were typically 60 $\mu$s for $\pi/2$ rotation.

FIG. 1 shows the bandwidth and pulse distortion associated with an unrefocussed sinc pulse applied to Sample A. Clearly, major signal loss will occur if further pulses are applied immediately to rotate this magnetization resulting from such a pulse to the z-axis because only those magnetization components which are orthogonal to the phase of the rf pulse are affected.

FIG. 2 shows the volume-selection possible with the pulse sequence of the present invention applied to Sample B. In this instance only one dimensional slicing was carried out and the clean editing obtained is clearly seen. FIGS. 2(a) to (c) are the volume-selected subspectra obtained showing only the resonances from vials (1), (2) and (3), respectively. These were each obtained using only a z-direction slice and are the result of 128 scans averaged into 2048 data points with a sweep width of 5kHz. FIG. 2(d) is the parent spectrum obtained with no volume-selection applied. The good suppression of signals outside of any particular slice is demonstrated by the elimination of this sodium phosphate signal from the spectra of the other two samples, particularly sample (1) which contains glucose-1-phosphate appearing only as a weakly discernible shoulder in the parent spectrum. Sample (3) actually contains a small amount of inorganic phosphate impurity, a result of chemical breakdown.

The effective volume-selection capability of the present method is again demonstrated in FIG. 3 where spectra of a rat carrying a tumour on its hind leg are shown. FIG. 3(a) shows the complete spectrum of the leg with signals from both the tumour (sugar phosphate and inorganic phosphate) and muscle (ATP and PCr). FIG. 3(b) shows a two dimensional z and x sliced version of the present method where the tumour signal only is shown. It has been shown chemically that no PCr or ATp are present in tumours of this type.

The present invention describes a new method for volume-selection in NMR spectroscopy. It is based on selective rf excitation of spins in the presence of a field gradient. In contrast to other approaches, the effect of chemical shift precession during the slice selection procedure is refocussed by a hard $\pi$ pulse and refocussing delay. This yields a coherent signal along a known axis and consequently maximum signal strength is obtained. The coherence of this magnetization of interest is safeguarded by placing it along the field axis during slice gradient fall times and then using a hard read pulse to acquire the high resolution signal. The technique can be extended to slice in all three dimensions and is based on the following principles.

In the presence of a field gradient, the Larmour frequency of nuclear spins varies with position. If a rf pulse with a narrow bandwidth is used to excite these spins, only those with Larmour frequency corresponding to the pulse will be excited. In this way, a slice of magnetization can be selected at the expense of all other magnetization. The width in space of this slice is dependent upon the frequency width of the pulse and the steepness of the gradient while the position of the slice is dependent on the central frequency of the pulse and the strength and direction of the applied gradient. It is limited by the requirement of hard homogenous pulses which cannot be applied by a surface coil. However, the good signal strength obtained compensates for this imposition particularly when one considers that the way is now clear for the present method to be applied to multipulse experiments with volume-selection in vivo.

In comparison with other approaches, the present invention has certain important advantages. In contrast to ISIS, it is less dependent on an add/subtract routine wherein the weak signals in the presence of very much stronger background tend not to be detected efficiently because of the limited dynamic range of spectrometer pre-amps and analogue to digital converters. Further, it is well known that good signal cancellation is heavily dependent upon magnet stability—certainly a serious consideration in unlocked clinical NMR magnets. The present invention eliminates signals from outside of the slice of interest before detection and so it does not suffer from these concerns.

Aue's VSE technique appears to lose signal because the signal is pulsed into the transverse plane but is in no way refocussed. This leads to serious signal loss.

In summary, the present invention provides a new technique which gives excellent volume-selection along with suppression from outside of the volume of interest. It is particularly suited to extension to other multipulse experiments. In particular, it is noted that a $^1H \rightarrow ^{13}C$ polarization transfer method is immediately obvious. Here the volume-selection could be performed in the proton regime where the spectral width demands are less demanding, and signal detection could then be carried out at the carbon frequency without the problems of a strong water signal and where signal overlap and homonuclear coupling is rarely a problem.

The embodiments described are by way of illustrative examples only and various changes and modifications may be made thereto without departing from the scope of the present invention defined in the appended claims.

We claim:

1. A method of volume-selected NMR spectroscopy including the steps of:
   (a) applying a first rf pulse of selected bandwidth and duration to a volume element in the sample body in the presence of a field gradient superimposed upon an initial homogenous magnetic field;
   (b) applying a hard refocussing pulse to the sample body to refocus a signal phase roll resulting from the first pulse in step (a), a time delay being dependent on the duration of the first pulse;
   (c) after the time delay from the termination of the hard refocussing pulse, pulsing a refocussed coherent signal back to a reference axis with a third pulse, and
   (d) recording the signal from the volume element, in the absence of the field gradient.

2. A method according to claim 1 wherein:
the initial slice selection pulse cluster is in the form $$G_{sl} \quad \diagup \overline{\qquad\qquad\qquad} \diagdown$$
$$rf \quad \frac{\pi}{2}(x)\pi[\pm y, \pm x] - \tau -$$

where $\pi/2(x)$ indicates the selective excitation which rotates magnetization through 90°, $\pi[\pm y, \pm x]$ is a nonselective 180° pulse which follows an exorcycle during 4 cycles through the pulse sequence and $\tau$ is the appropriate refocussing time.

3. A method according to claim 2 wherein:
the selective excitation is a sinc pulse; and
a maximum coherent transverse signal is obtained from spins within the slice in the presence of a suitable field gradient.

4. A method according to claim 1 wherein:
steps (a) to (d) in claim 1 are repeated in all three orthogonal directions before recording step (e).

5. A method according to claim 1 wherein:
recording the signal in the absence of the field gradient includes the steps of:
pulsing the magnetization back to the reference axis so that the dephasing of transverse coherence which takes place in the presence of the field gradient has no effect on the excited slice;
after a time determined by the rate at which the field gradient falls to zero, the magnetization of the slice is again pulsed to the transverse plane; and
the signal is acquired with the high resolution chemical shift information required for biochemical analysis.

6. A method according to claim 1 wherein:
the pulse sequence is $$G_{sl} \quad \left[ \diagup \overline{\qquad\qquad\qquad} \diagdown \right]$$
$$rf \quad \left[ \frac{\pi}{2}(x)\pi[\pm y, \pm x] - \tau - \frac{\pi}{2}[\pm x] - \right] t_1 - \frac{\pi}{2}[\pm x] \text{ acquire}$$

7. A method according to claim 1 wherein:
the refocussing pulse is used to refocus the off-resonance phase characteristics formed by excitation of the magnetization by the first rf pulse in the presence of the field gradient.

* * * * *